(12) United States Patent
Ahn et al.

(10) Patent No.: US 6,534,400 B2
(45) Date of Patent: Mar. 18, 2003

(54) METHOD FOR DEPOSITING A TUNGSTEN SILICIDE LAYER

(75) Inventors: Jae Young Ahn, Seongnam-si (KR); Woo Sung Lee, Yongin-si (KR); Man Sug Kang, Yongin-si (KR); Hee Seok Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/039,165

(22) Filed: Jan. 3, 2002

(65) Prior Publication Data

US 2002/0137315 A1 Sep. 26, 2002

(30) Foreign Application Priority Data

Feb. 6, 2001 (KR) .......................................... 2001-5513

(51) Int. Cl.[7] .......................................... H01L 21/4763
(52) U.S. Cl. ...................... 438/649; 438/592; 438/655; 438/630; 438/683
(58) Field of Search ................................ 438/649, 655, 438/674, 677, 680, 682, 683, 664, 648, 647, 642, 630, 592; 427/96, 99, 250, 252, 253, 255.392; 257/413, 412, 382, 383, 377, 384, 755, 757

(56) References Cited

U.S. PATENT DOCUMENTS 6,022,586 A  *  2/2000  Hashimoto et al. ..........  134/1.1
6,245,673 B1  *  6/2001  Okubo et al. ...............  438/301

* cited by examiner

*Primary Examiner*—Carl Whitehead, Jr.
*Assistant Examiner*—Thanhha Pham
(74) *Attorney, Agent, or Firm*—Mills & Onello LLP

(57) ABSTRACT

Disclosed is a method for depositing a tungsten silicide layer on a wafer coated with a polysilicon layer in a CVD process chamber. A surface of the polysilicon layer is pre-treated by introducing a hydrogen compound gas including any elements among group III elements or group V elements of the periodic table into the CVD process chamber. The tungsten silicide layer is deposited on the polysilicon layer by introducing a silane source gas and a tungsten source gas into the CVD process chamber. Since the surface of the polysilicon layer is pre-treated using the hydrogen compound gas before the tungsten silicide layer is deposited on the polysilicon layer, void generation is prevented on an interfacial surface between the tungsten silicide layer and the polysilicon layer.

16 Claims, 10 Drawing Sheets though the characteristics of the tungsten silicide layer can be improved, if the tungsten silicide layer is used for the gate electrode having a multi-layer structure of polysilicon/tungsten silicide which requires a re-oxidation process after a patterning process is performed, voids are created on the polysilicon layer while the above processes are being carried out. The voids deteriorate the reliability of the device.

METHOD FOR DEPOSITING A TUNGSTEN SILICIDE LAYER

BACKGROUND OF THE INVENTION

1. Field of the Invention

The present invention relates to a method for depositing a tungsten suicide layer, and more particularly to a method for depositing a tungsten silicide layer on a polysilicon layer using dichlorosilane gas as a silane source gas so as to prevent void generation on an interfacial surface formed between the polysilicon layer and the tungsten silicide layer.

2. Description of the Related Art

Generally, in a semiconductor memory device such as a DRAM (dynamic random access memory), a multi-layer structure consisting of a polysilicon layer and a tungsten silicide layer is widely used as a conductive layer so as to improve the electrical conductivity of a word line by combining a high resistance characteristic of the polysilicon layer and a low resistance characteristic of the tungsten silicide layer.

The deposition of the tungsten silicide layer is generally carried out by a CVD (chemical vapor deposition) process, wherein hexafluoride ($WF_6$) gas is deoxidized using monosilane (SiH4) gas, hydrogen (H2) gas or silicon (Si).

According to the conventional method, the density of fluorine atoms accumulated on the tungsten silicide layer exceeds $1.0 \times 10^{20}$ atoms/cc when the tungsten silicide layer is deposited on the polysilicon layer by deoxidizing the hexafluoride ($WF_6$) gas using the monosilane ($SiH_4$) gas.

The high-density fluorine atoms accumulated in the tungsten silicide layer causes the diffusion of boron (B) thereby lowering the device characteristics. Particularly, in the case of a gate electrode, the threshold voltage of a transistor is shifted and the thickness of a gate oxide layer increases.

In addition, step coverage and an adhesive feature of the deposited tungsten silicide layer are poor. In order to solve the above problems, a post annealing process is carried out. However, the tungsten silicide layer can be cracked and delaminated while the post annealing process is being carried out.

Recently, dichlorosilane ($SiH_2Cl_2$; DCS) gas is widely used as a deoxidizing gas for depositing the tungsten silicide layer so as to solve the problems caused by the monosilane gas.

If the $WF_6$ gas is deoxidized using the DSC gas, the density of the fluorine atoms accumulated in the tungsten silicide layer is reduced by $1.0 \times 10^3$ times as compared with the density when the monosilane ($SiH_4$) gas is used as the deoxidizing gas. Further, the step coverage and the adhesive characteristic against the polysilicon layer can be improved.

However, though the characteristics of the tungsten silicide layer can be improved, if the tungsten silicide layer is used for the gate electrode having a multi-layer structure of polysilicon/tungsten silicide which requires a re-oxidation process after a patterning process is performed, voids are created on the polysilicon layer while the above processes are being carried out. The voids deteriorate the reliability of the device.

FIG. 1 is a view showing a structure of a gate electrode layer of DRAM device. In order to fabricate the gate electrode layer, a gate oxide film 12, a polysilicon layer 14, a tungsten silicide layer 16, a nitride film 18 and an oxide film 20 are sequentially stacked on a substrate 10 and then the stacked layers are patterned. The polysilicon layer 14 and the tungsten silicide layer 16 are used as a gate conductive layer and the nitride film and the oxide film are used as a mask layer.

After forming the gate electrode layer, a re-oxidation process is carried out. At this time, chlorine atoms contained in the dichlorosilane gas are accumulated on the polysilicon layer 14. When the re-oxidation process is carried out, silicon diffuses from the polysilicon layer 14 into the tungsten silicide layer 16 so that voids 22 are created. The chlorine accumulated on the polysilicon layer facilitates the creation of the voids 22.

In order to reduce the creation of the voids 22, as shown in FIG. 1, a thermal oxidation process was carried out with respect to the monocrystalline silicon wafer 10, so that the oxide film 12 having a thickness of 100 Å was formed. Then, the doped polysilicon layer 14 having a thickness of 1,000 Å was formed by means of an LPCVD process. After that, the tungsten silicide layer 16 was formed on the polysilicon layer 14 by introducing a mixing gas of the $WF_6$ gas and the DCS gas. Then, the nitride film 18 and the oxide film having a thickness of 3,000 Å were formed so as to be used as the mask layer.

After that, the gate electrode layer was defined by coating a photoresist film on the resultant structure, exposing the photoresist film and then developing the exposed photoresist film. The gate electrode layer was patterned by etching a lower layers of the resultant structure through a dry etching process.

Then, as shown in FIG. 2, the oxidation process was carried out for 60 to 100 minutes in an $O_2$ atmosphere at a temperature of 850° C. As a result, a thermal oxide film 24 was formed at a sidewall of the gate electrode layer.

Then, as shown in FIG. 3, the nitride layer 18 and the oxide layer 20 as mask layers were etched using a wet etching process. After that, as shown in FIG. 4, the tungsten silicide layer 16 was selectively etched.

When the surface of the exposed polysilicon layer 14 was observed using analyzing apparatus such as SEM/TEM/AFM, the voids 22 were detected.

As mentioned above, when the tungsten silicide layer is deposited according to the conventional method, a great amount of dichlorosilane is introduced into the process chamber at an early stage so that chlorine atoms are accumulated on the polysilicon layer 14. Therefore, when the re-oxidation process is carried out, silicon diffuses through the tungsten silicide layer so that voids 22 are created. The chlorine atoms accumulated on the polysilicon layer 14 facilitate the creation of the voids 22.

The voids 22 created on the polysilicon layer 14 deteriorate the reliability of the device and cause the failure of the device thereby lowering the yield of the device.

SUMMARY OF THE INVENTION

The present invention has been made to solve the above problems of the prior art. It is an object of the present invention to provide a method for depositing a tungsten suicide layer. The tungsten silicide layer is deposited by deoxidizing a $WF_6$ gas using a DSC gas on a polysilicon layer. The surface of the polysilicon layer is pre-treated using a hydrogen compound gas including any one selected from the group consisting of group III elements and group V elements of the periodic table of the elements before the tungsten silicide layer is deposited, thereby preventing voids from being created at the polysilicon layer.

In accordance with the invention, there is provided a method for depositing a tungsten silicide layer on a substrate coated with a polysilicon layer in a CVD process chamber. A surface of the polysilicon layer is pre-treated by introducing into the CVD process chamber a hydrogen compound gas including elements selected from group III elements or group V elements of the periodic table. Then, the tungsten silicide layer is deposited on the polysilicon layer by introducing a silane source gas and a tungsten source gas into the CVD process chamber.

For example, the hydrogen compound gas may be $PH_3$ (phosphine), $B_2H_6$ (diborane), $AsH_3$, or a mixture thereof. A hydrogen compound gas made of elements selected form group V elements is used for NMOS and a hydrogen compound gas made of elements selected form group III elements is used for PMOS.

As a silane source gas, a dichlorosilane gas ($SiH_2Cl_2$) may be used. As a tungsten source gas, a tungsten hexafluoride ($WF_6$) gas may be used.

Since the hydrogen compound gas including elements selected from group III elements or group V elements of the periodic table is absorbed on the surface of the polysilicon layer and the DCS gas is reacted with the absorbed hydrogen compound at the surface of the polysilicon layer, fluorine atoms are not accumulated on the polysilicon layer.

An inert gas such as a He gas or an Ar gas may be mixed with the hydrogen compound gas when the pre-treatment step is carried out.

In one embodiment, the hydrogen compound gas is introduced into the CVD process chamber for 1 to 120 seconds. A flow rate of the hydrogen compound gas introduced into the CVD process chamber is in a range of 1 to 500 sccm. A temperature of the substrate is maintained in a range of 100 to 700° C. when the hydrogen compound gas is introduced into the CVD process chamber. Preferably, the hydrogen compound gas is introduced into the CVD process chamber more than 10 seconds, the flow rate of the hydrogen compound gas introduced into the CVD process chamber is in a range of 20 to 200 sccm, and the temperature of the substrate is maintained above 400° C. when the hydrogen compound gas is introduced into the CVD process chamber.

When a nucleus of the tungsten silicide is formed, the dichlorosilane (DCS) gas and the $WF_6$ gas are introduced into the CVD process chamber in a flow rate ratio of about 100:1 to 500:1, preferably 100:1 to 300:1. At this time, the chlorine radicals dissociated from the DCS gas are reacted with hydrogen radicals absorbed on the surface of the polysilicon layer. Accordingly, the chlorine radicals are transformed into HCl so that the chlorine atoms are removed without permeating into the polysilicon layer.

In one embodiment, an inert gas such as an argon gas or a nitrogen gas is used as a carrier gas. A $PH_3$ gas can be added to modify a grain size of the deposited tungsten silicide. Therefore, the composition ratio of W/Si can be adjusted so that a thin film having a uniform composition ratio of W/Si in the thickness direction (or the deposition direction) of the deposited thin film can be fabricated. In this manner, after the nuclei of the tungsten silicide have been formed, the variation of the thickness of the polysilicon layer, that is, the reduction of the thickness of the polysilicon layer, can be prevented when the tungsten suicide layer is deposited on the polysilicon layer.

While the deposition step is being carried out, the temperature of the substrate is maintained in the range of about 500 to 700° C., preferably, about 570 to 650° C. The pressure in the CVD process chamber is maintained at the range of about 0.5 to 10 Torr, preferably about 0.7 to 9.5 Torr.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

Hereinafter, preferred embodiments of the present invention will be described in detail with reference to FIGS. 5 to 12.

Figure 1:
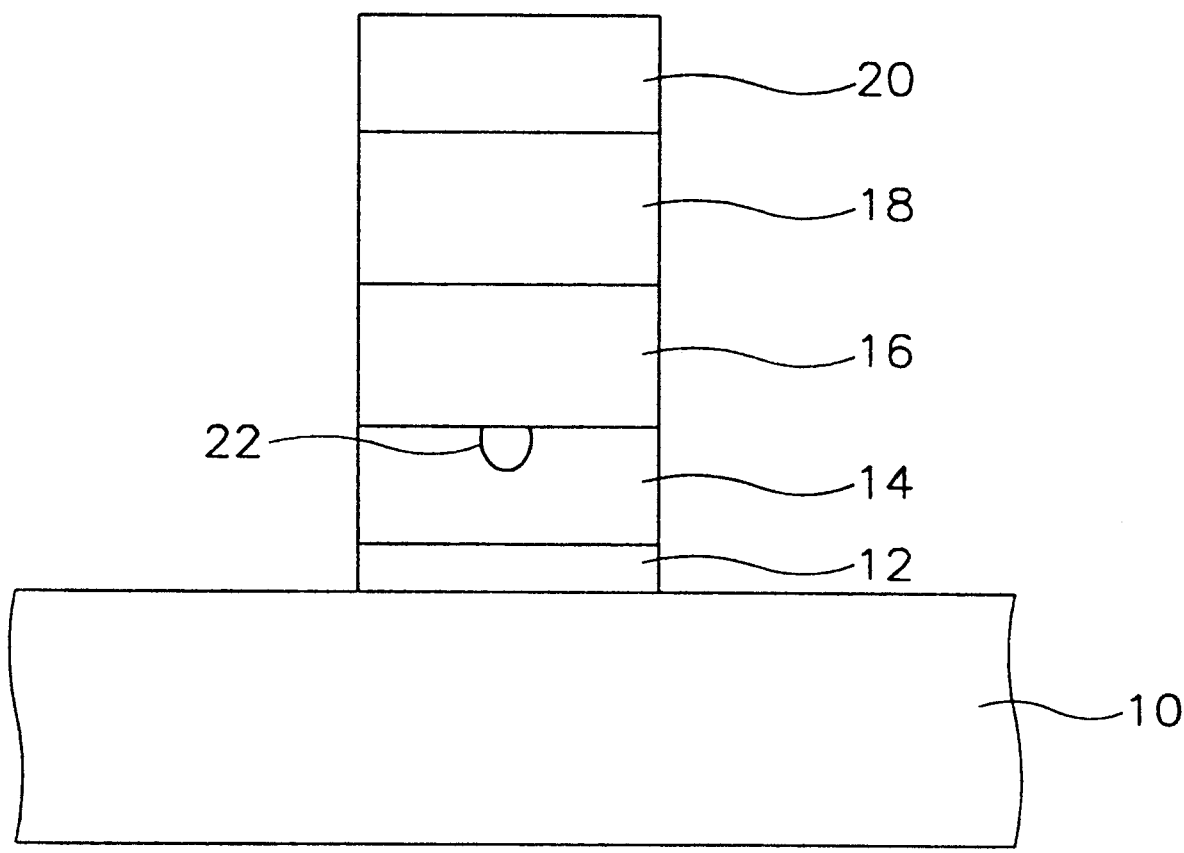
FIG. 1 is a sectional view showing a conventional gate electrode layer having a multi-layer structure of polysilicon and tungsten silicide.
Figure 2:
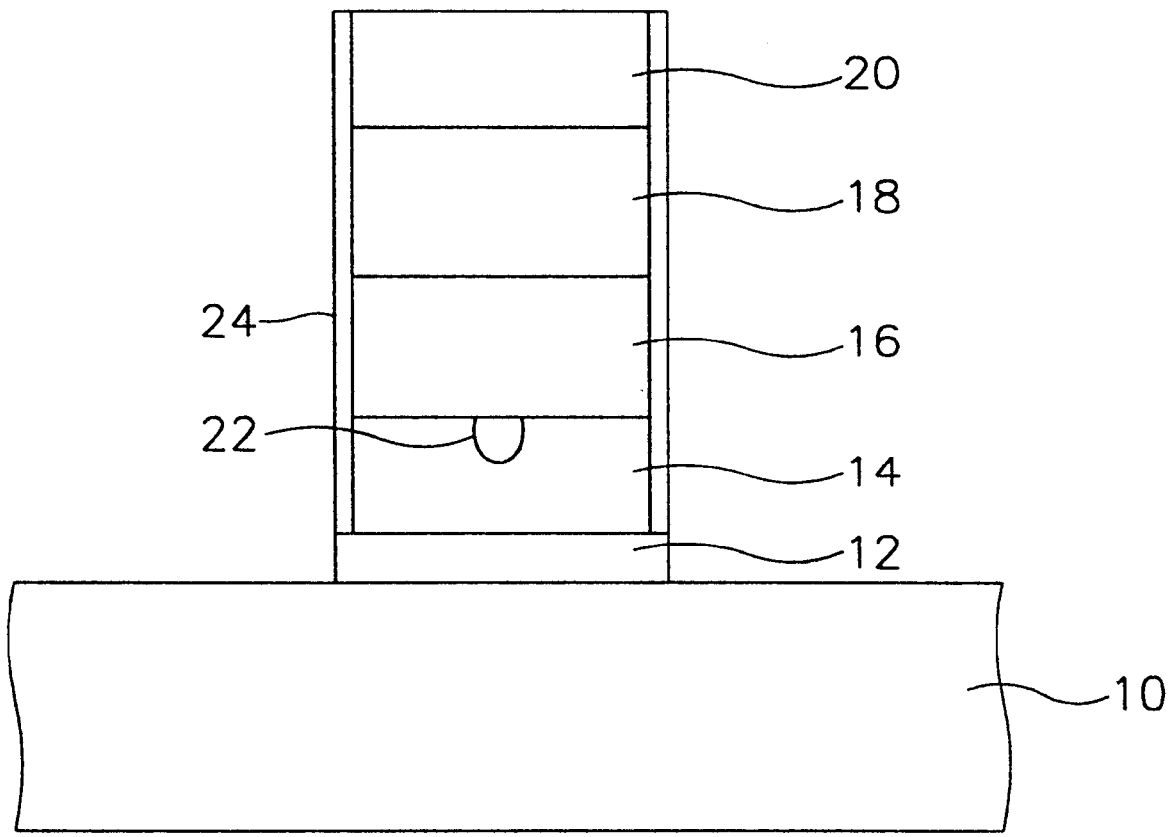
FIGS. 2 to 4 are views showing the creation of voids during a conventional tungsten suicide depositing process.
Figure 3:
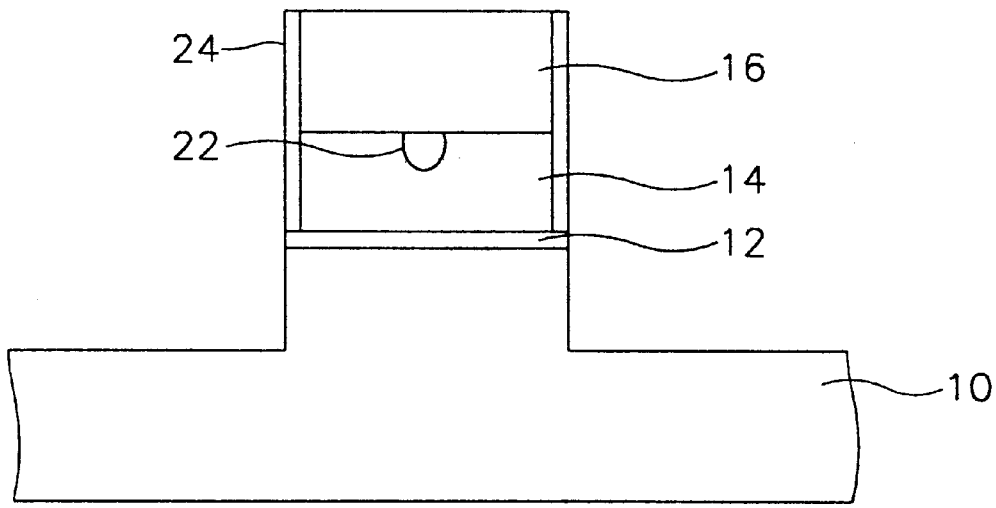
Figure 4:
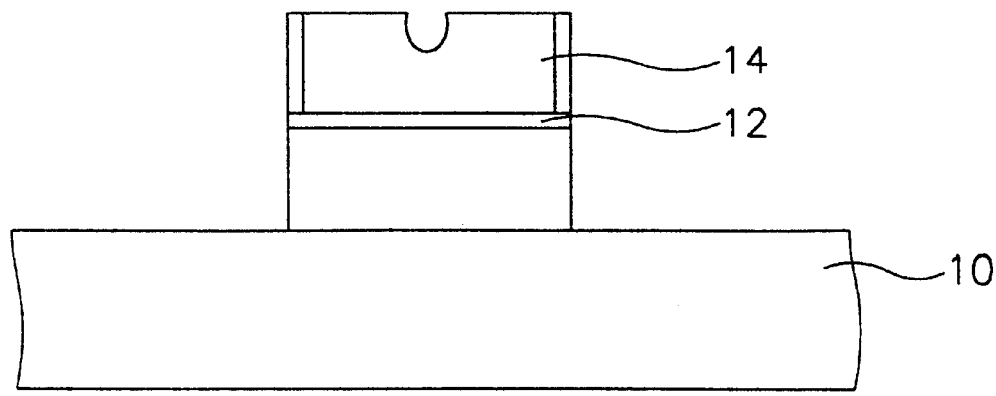
Figure 5:
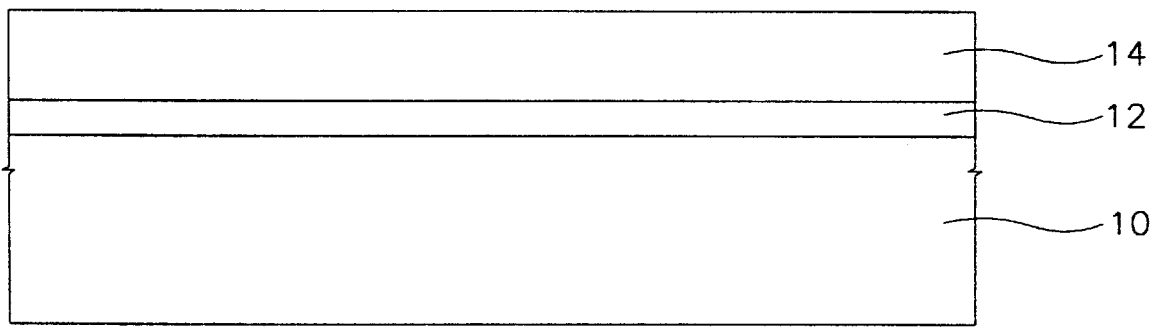
FIGS. 5 to 10 are views showing a gate electrode layer forming process using a tungsten silicide depositing method according to one embodiment of the present invention.

Referring to FIG. 5, a field oxide isolating layer is formed on a silicon substrate 10. A gate oxide film 12 having a thickness of 50 to 100 Å is formed on the surface of the silicon substrate 10. A doped polysilicon layer 14 having a thickness of 1,000 Å is formed on the gate oxide film 12.

Figure 6:
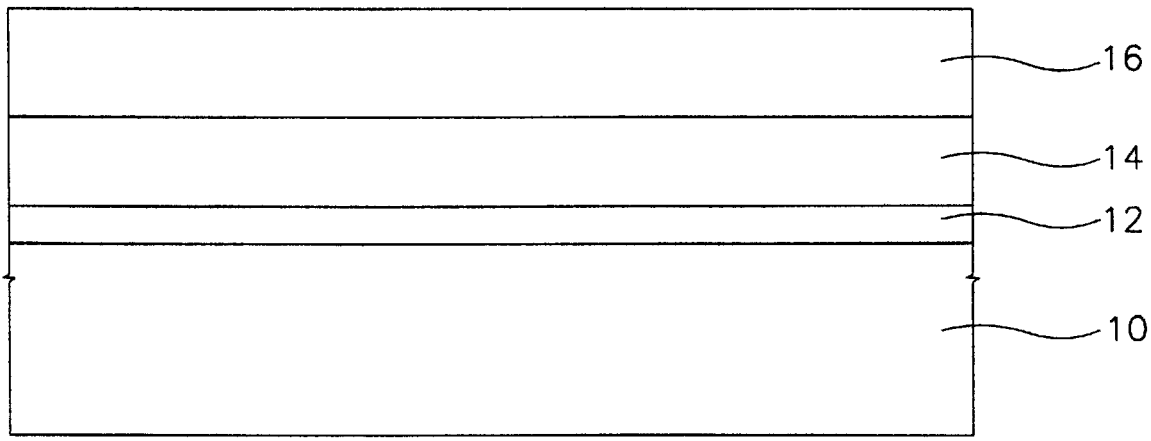

Referring to FIG. 6, the silicon substrate 10 formed with the polysilicon layer 14 is loaded in a process chamber so as to deposit a tungsten silicide layer 16 on the polysilicon layer 14 to a thickness of 1,000 Å according to the tungsten silicide depositing process of the present invention.

Figure 7:
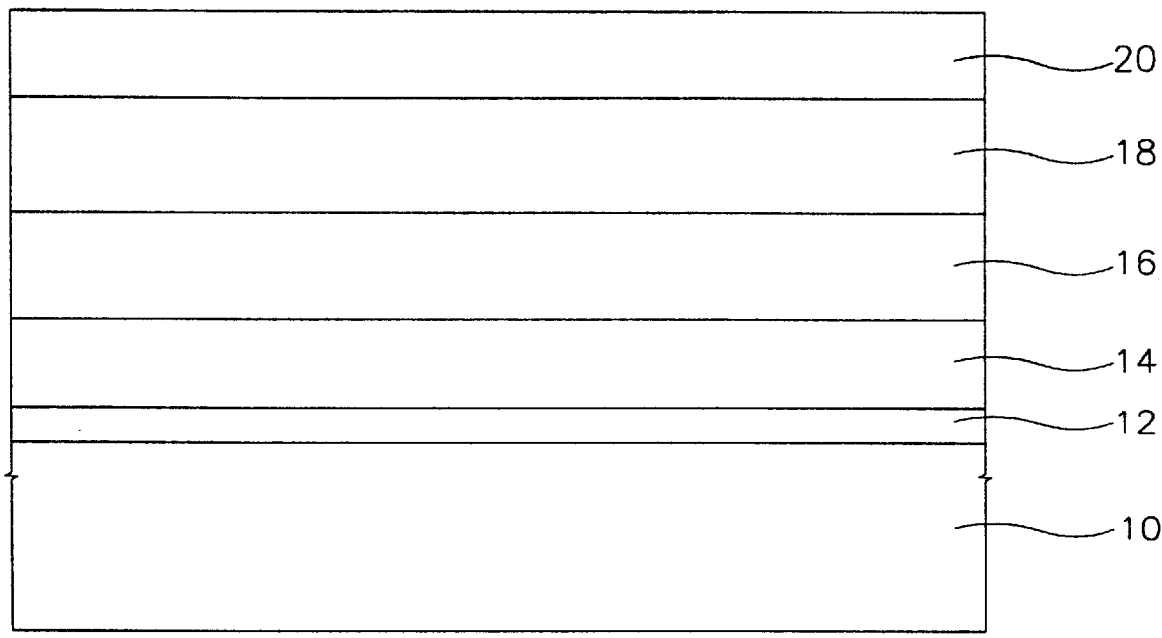

Referring to FIG. 7, a nitride film 18 is deposited on the tungsten silicide layer 16 to a thickness of 1500 Å using a CVD process. Then, a thermal oxide film 20 is coated on the nitride film 18 to a thickness of 500Å. The nitride film 18 and the oxide film 20 are used as a mask layer when a self align contact manufacturing process is carried out.

Figure 8:
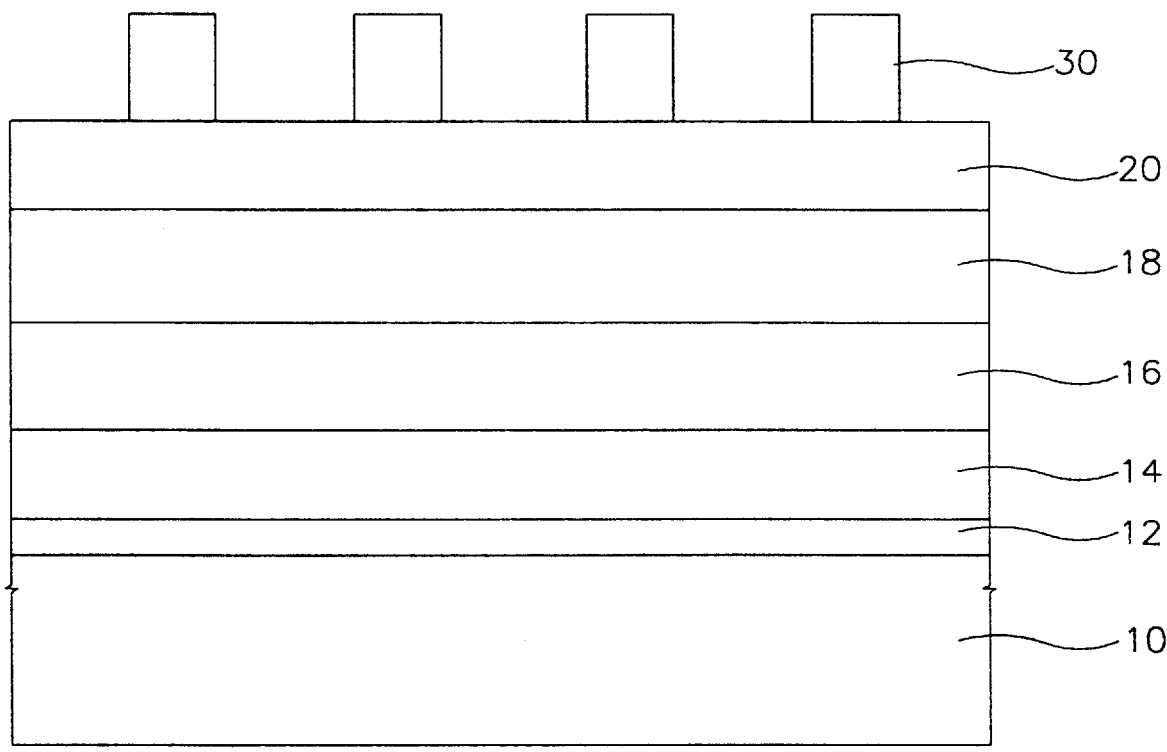
Figure 9:
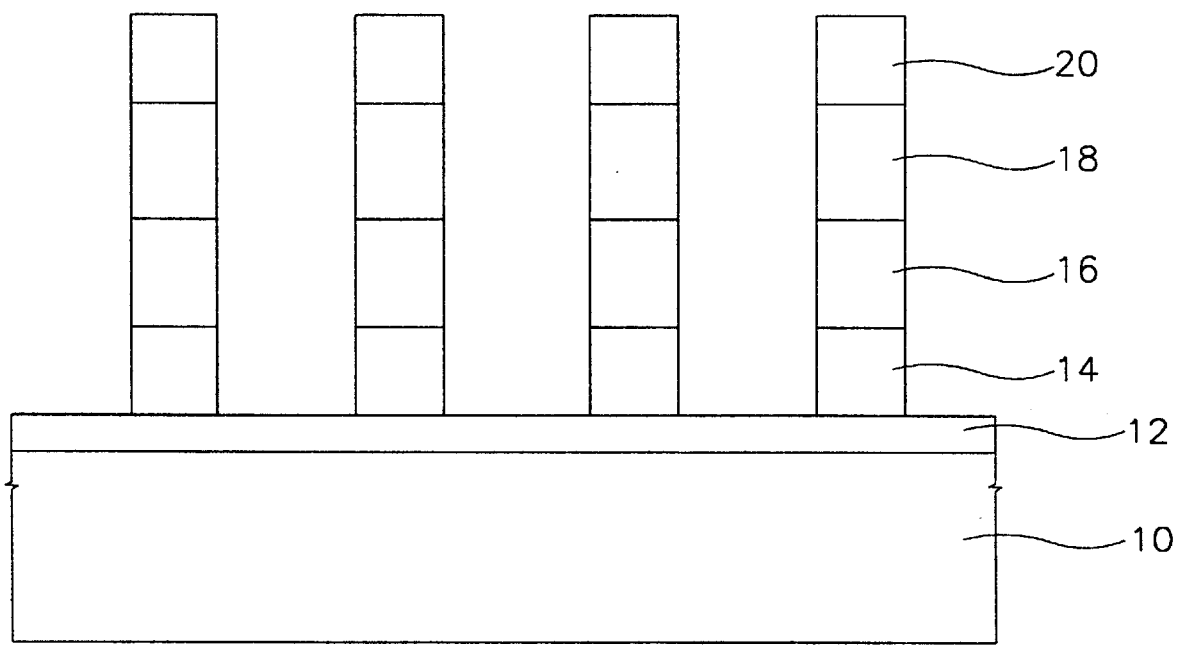

Referring to FIG. 8, a gate photoresist pattern 30 is formed so as to form a gate electrode pattern. Using the photoresist pattern 30 as an etching mask, the oxide film 20, the nitride film 18, the tungsten silicide layer 16 and the polysilicon layer 14 are sequentially etched thereby forming a gate pattern as shown in FIG. 9.

Figure 10:
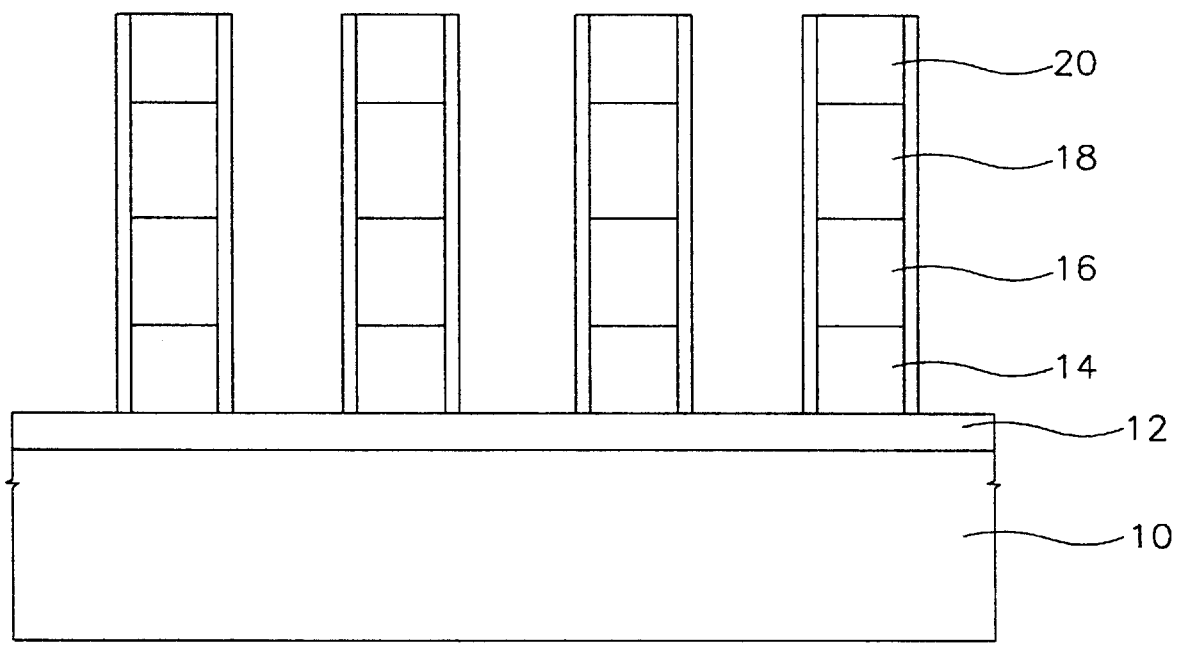

Referring to FIG. 10, after forming the gate pattern, the gate oxide film 12 on the silicon substrate 10 exposed by the etching process is removed. Then, the re-oxidation process is carried out for preparing an ion implantation process, for graded gate oxide (GGO), or for restoring the fault.

Figure 11:
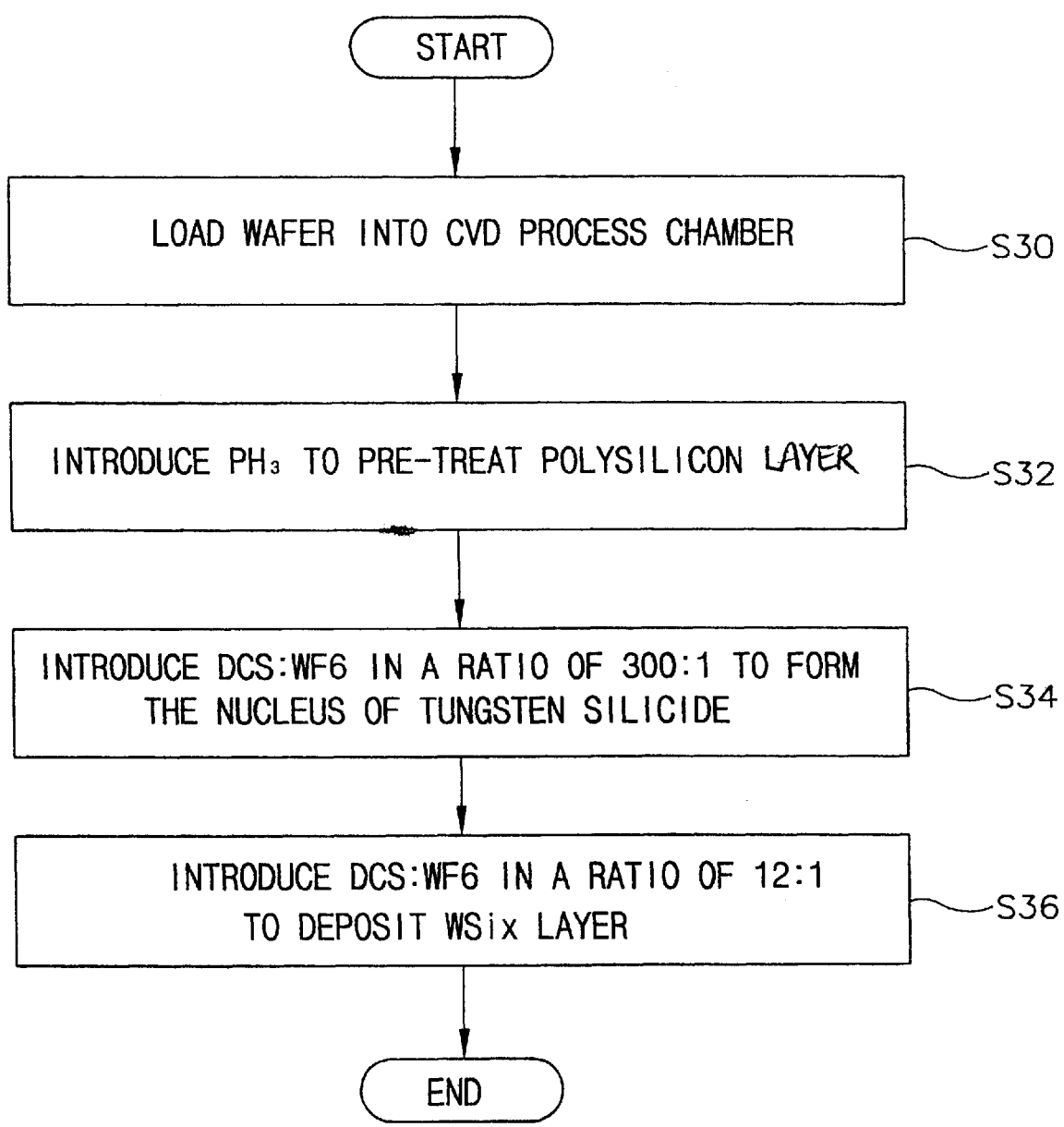
FIG. 11 is a flow chart of a tungsten suicide depositing process according to one embodiment of the present invention.
Figure 12:
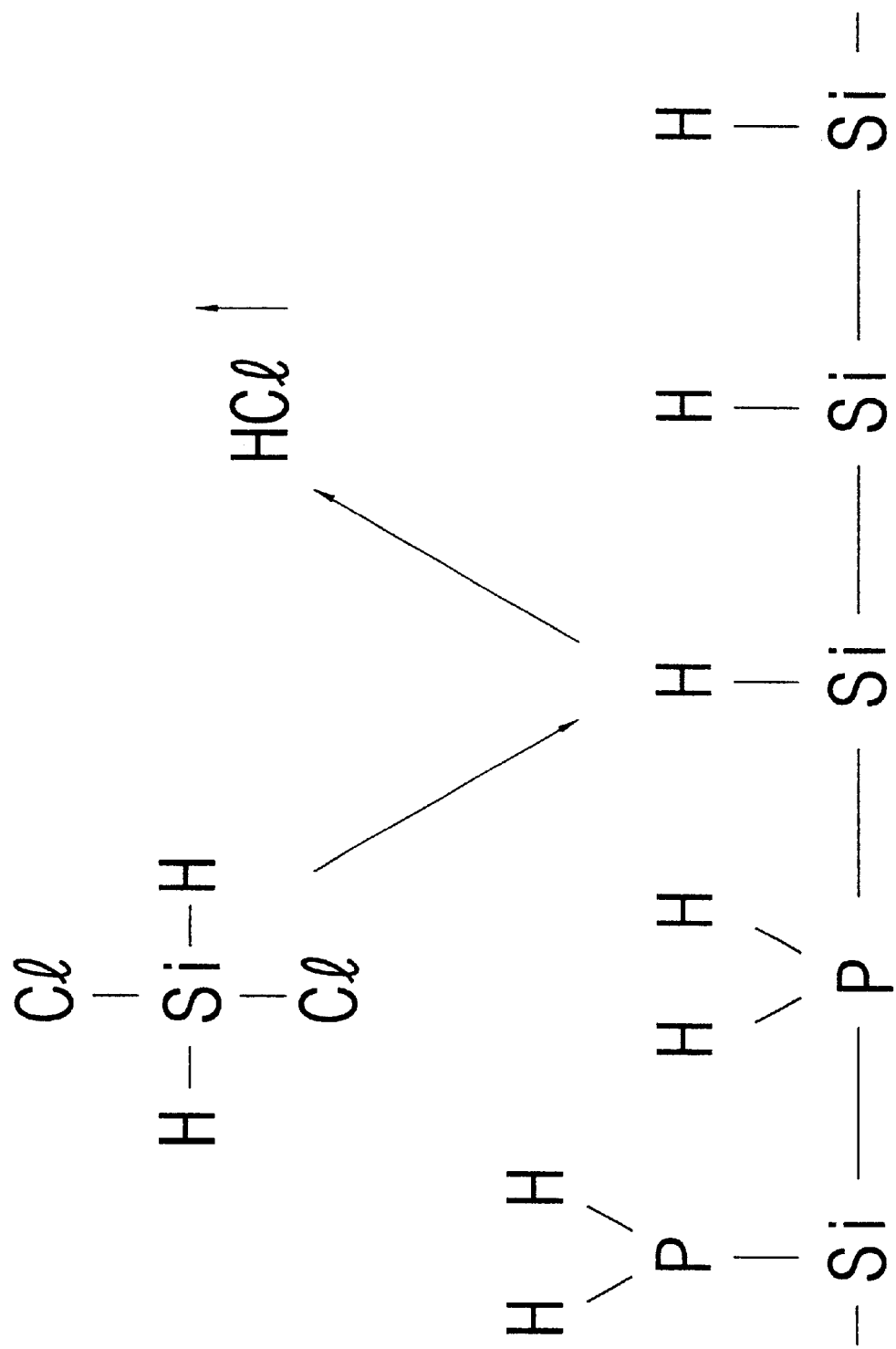
FIG. 12 is a view showing a reaction mechanism of a pre-treatment process of a tungsten silicide depositing process according to one embodiment of the present invention.

Hereinafter, the tungsten silicide depositing process is described with reference to FIG. 11, After loading the wafer into the CVD process chamber, argon gases Ar-1 and Ar-2 in the flow amount of 200 sccm, are introduced into the CVD process chamber for 60 seconds while maintaining the chamber pressure at 9.5 Torr and the wafer temperature at 610° C., to thereby adjust the atmosphere in the CVD process chamber (step S30).

Then, the PH$_3$ gas in a flow amount of 120 sccm is introduced into the process chamber for 60 seconds while maintaining the same pressure and temperature condition, thereby pre-treating the surface of the polysilicon layer (step S32). At this time, the hydrogen compound is deposited on the surface of the polysilicon layer.

After that, a mixture gas including the argon gas Ar-1 at 20 sccm, the DCS gas at 300 sccm and the PH$_3$ gas at 60 sccm is introduced into the process chamber for 10 seconds. At this time, the temperature of the wafer is constantly maintained and the pressure of the process chamber is reduced to 4.5 Torr. The chlorine atoms dissociated from the DCS gas react with hydrogen radicals adhering to the surface of the polysilicon layer so that the chlorine atoms are transformed into HCl and thus are removed (refer to FIG. 12) from the surface of the polysilicon layer without permeating into the polysilicon layer.

Then, the WF$_6$ gas in a flow amount of 1 sccm is introduced into the process chamber for 40 seconds while maintaining the same flow rate of the mixture gas so as to form the nucleus of the tungsten silicide on the surface of the polysilicon layer (step S34). At this time, the chlorine atoms dissociated from the DCS gas react with the remaining hydrogen radicals absorbed to the surface of the polysilicon layer so that the chlorine atoms are transformed into HCl and thus the chlorine atoms are removed from the surface of the polysilicon layer.

Next, a mixture gas including the argon gas Ar-1 (carrier gas of WF$_6$ gas) at 150 sccm, the argon gas Ar-2 (carrier gas of the DCS gas) at 200 sccm, the WF$_6$ gas at 7 sccm and the DCS gas of 85 sccm is introduced into the process chamber for 40 seconds so that the tungsten suicide layer is deposited on the surface of the polysilicon layer about the nucleus of the tungsten silicide (step S36).

Then, the argon gas Ar-1 at 200 sccm and the argon gas Ar-2 at 200 sccm are introduced into the process chamber for 5 seconds. After that, a waiting step is performed for 5 seconds without introducing gases into the process chamber.

As described above, when the tungsten silicide is deposited on the polysilicon layer using the DCS gas as a silicon source gas, the surface of the polysilicon layer is pre-treated using the PH$_3$ gas.

When the re-oxidation process is carried out, the voids are created on the polysilicon layer since silicon is diffused from the polysilicon layer through the tungsten silicide layer. At this time, the chlorine atoms adhered to the polysilicon layer facilitate the creation of the voids.

However, according to the present invention, the polysilicon layer is pre-treated using the hydrogen compound gas so that the chlorine atoms are removed without permeating into the polysilicon layer. Therefore, since the chlorine atoms are removed, the voids are prevented from being created on the polysilicon layer when the re-oxidation process is carried out.

After the re-oxidation process has been finished, a source/drain ion implantation process is first carried out. Then, a side wall spacer is formed on a side well of the gate pattern. Using the side wall spacer as a mask, a source/drain ion implantation process is second carried out so that a cell transistor having a LDD (lightly doped drain) structure is fabricated.

Table 1 shows the process condition of the tungsten silicide depositing process according to the preferred embodiment of the present invention.

TABLE 1

| Step | Time (sec) | Temp (° C.) | Press (Torr) | WF$_6$ (sccm) | Ar-1 (sccm) | DCS (sccm) | Ar-2 (sccm) | PH$_3$ (sccm) | Remarks |
|---|---|---|---|---|---|---|---|---|---|
| 1 | 60 | 610 | 9.5 | — | 200 | — | 200 | — | |
| 2 | 60 | 610 | 9.5 | — | — | — | — | 120 | PT |
| 3 | 10 | 610 | 4.5 | — | 20 | 300 | — | 60 | |
| 4 | 40 | 610 | 4.5 | 1 | 20 | 300 | — | 60 | NF |
| 5 | 40 | 610 | 4.5 | 7 | 150 | 85 | 200 | — | De |
| 6 | 5 | 610 | 4.5 | — | 200 | — | 200 | — | |
| 7 | 5 | 610 | 4.5 | — | — | — | — | — | End |

In the table, PT is a pre-treatment, NF is nucleus formation, and De is deposition.

As mentioned above, according to the present invention, the surface of the polysilicon layer is pre-treated by introducing the hydrogen compound gas including an element selected from group III elements and group V elements of the periodic table into the CVD process chamber before the mixture gas of the DCS gas and the WF$_6$ gas is introduced onto the surface of the polysilicon layer for depositing the tungsten silicide layer. Therefore, the chlorine atoms dissociated from the DCS gas are removed without permeating into the polysilicon layer so that the density of the chlorine atoms in the polysilicon layer is greatly reduced.

Since the generation of the voids is prevented in the polysilicon layer, the reliability of the device is improved.

In addition, by pre-treating the surface of the polysilicon layer using the hydrogen compound gas including an element selected from group III elements or group V elements of the periodic table, impurities of group III elements (in case of PMOS) or impurities of group V elements (in case of NMOS) are diffused into the polysilicon layer, so the thickness of a depletion layer of a carrier can be reduced thereby improving the electrical features of the device.

While the present invention has been described in detail with reference to the preferred embodiment thereof, it should be understood to those skilled in the art that various changes, substitutions and alterations can be made hereto without departing from the scope of the invention as defined by the appended claims.

What is claimed is:

1. A method for depositing a tungsten silicide layer on a wafer coated with a polysilicon layer in a CVD process chamber, the method comprising the steps of:

i) pre-treating a surface of the polysilicon layer by introducing into the CVD process chamber a hydrogen compound gas including at least one element selected from the group consisting of group III elements and group V elements of a periodic table, thereby depositing the hydrogen on the surface of the polysilicon layer; and ii) depositing the tungsten silicide layer on the polysilicon layer by introducing a silane source gas comprising chlorine atoms and a tungsten source gas into the CVD process chamber, while chlorine atoms disassociated from the silane source gas react with hydrogen radicals deposited on the surface of the polysilicon layer, thereby removing the chlorine atoms from the surface of the polysilicon layer.

2. The method as claimed in claim 1, wherein the silane source gas includes dichlorosilane.

3. The method as claimed in claim 2, wherein the tungsten source gas includes tungsten hexafluoride.

4. The method as claimed in claim 1, wherein the hydrogen compound gas is selected from a group consisting of $PH_3$, $B_2H_6$, $AsH_3$, and a mixture thereof.

5. The method as claimed in claim 1, wherein, in step i), an inert gas including at least one of He, Ar and a mixture thereof is mixed to the hydrogen compound gas.

6. The method as claimed in claim 1, wherein the hydrogen compound gas is introduced into the CVD process chamber for about 1 to 120 seconds.

7. The method as claimed in claim 1, wherein the hydrogen compound gas is introduced into the CVD process chamber more than about 10 seconds.

8. The method as claimed in claim 1, wherein a flow rate of the hydrogen compound gas introduced into the CVD process chamber is in a range of about 1 to 500 sccm.

9. The method as claimed in claim 1, wherein a flow rate of the hydrogen compound gas introduced into the CVD process chamber is in a range of about 20 to 200 sccm.

10. The method as claimed in claim 1, wherein a temperature of the wafer is maintained in a range of about 100 to 700° C. when the hydrogen compound gas is introduced into the CVD process chamber.

11. The method as claimed in claim 1, wherein a temperature of the wafer is maintained above about 400° C. when the hydrogen compound gas is introduced into the CVD process chamber.

12. A method for depositing a tungsten silicide layer on a wafer coated with a polysilicon layer in a CVD process chamber, the method comprising the steps of:

i) pre-treating a surface of the polysilicon layer by introducing into the CVD process chamber a hydrogen compound gas including an element selected from the group consisting of group III elements and group V elements of a periodic table, thereby depositing the hydrogen on the surface of the polysilicon layer;

ii) forming a nucleus of tungsten silicide on the polysilicon layer by introducing a dichlorosilane gas and a tungsten source gas into the CVD process chamber at a flow rate ratio of about 100:1 to 500:1, while chlorine atoms disassociated from the dichlorosilane gas react with hydrogen radicals deposited on the surface of the polysilicon layer, thereby removing the chlorine atoms from the surface of the polysilicon layer; and iii) depositing the tungsten silicide layer on the nucleus of tungsten suicide by introducing the dichlorosilane gas and the tungsten source gas into the CVD process chamber at a flow rate ratio of about 10:1 to 100:1.

13. The method as claimed in claim 12, wherein a temperature of the wafer in the CVD chamber is maintained in a range of about 500 to 700° C. during deposition of the tungsten silicide layer.

14. The method as claimed in claim 12, wherein a temperature of the wafer in the CVD chamber is uniformly maintained in a range of about 570 to 710° C. during deposition of the tungsten silicide layer.

15. The method as claimed of claim 12, wherein a first pressure formed in the CVD process chamber when the hydrogen compound gas is introduced into the CVD process chamber is higher than a second pressure formed in the CVD process chamber when the nucleus of the tungsten silicide is formed or when the depositing step is carried out.

16. The method as claimed in claim 14, wherein the hydrogen compound gas is introduced into the CVD process chamber for more than about 10 seconds.

* * * * *

UNITED STATES PATENT AND TRADEMARK OFFICE
CERTIFICATE OF CORRECTION

PATENT NO.   : 6,534,400 B2
DATED        : March 18, 2003
INVENTOR(S)  : Jae Young Ahn et al.

It is certified that error appears in the above-identified patent and that said Letters Patent is hereby corrected as shown below:

<u>Column 8,</u>
Line 21, please delete "suicide" and insert -- silicide --.

Signed and Sealed this

Sixteenth Day of September, 2003

JAMES E. ROGAN
*Director of the United States Patent and Trademark Office*